United States Patent [19]
Schmidt et al.

[11] Patent Number: 5,958,572
[45] Date of Patent: Sep. 28, 1999

[54] HYBRID SUBSTRATE FOR COOLING AN ELECTRONIC COMPONENT

[75] Inventors: Detlef Schmidt, Schaumburg; Martin R. Pais, North Barrington, both of Ill.

[73] Assignee: Motorola, Inc., Schaumburg, Ill.

[21] Appl. No.: 08/941,793

[22] Filed: Sep. 30, 1997

[51] Int. Cl.$^6$ ........................................................ B32B 3/26
[52] U.S. Cl. .................................... 428/320.2; 428/322.7; 428/304.4; 428/306.6; 174/258
[58] Field of Search .................... 174/256, 258; 428/320.2, 322.7, 304.4, 306.6

[56] References Cited

U.S. PATENT DOCUMENTS 5,296,310  3/1994  Kibler et al. ............................ 428/614

OTHER PUBLICATIONS

Product Description Documents by Advanced Ceramics Corp. for the following products: TC1050 Encapsulated TPG; TC1050.ALY Aluminum Encapsulated TPG; TC1050.CFC Carbon FIber Composite encapsulated TPG; TC1050.KOV Kovar Encapsulated TPG; TC1050.CO Copper Encapsulated TPG; TC1050.MMC A1SiC Encapsulated TPG/ Jan. 1995.

Product Overview Document for "TC1050 Thermal Management Material System" by Advanced Ceramics Corp. Dec., 1994.

Preliminary Product Data for "High Thermal Conductivity Black–Ice ™ Substrate Materials", Applied Sciences, Inc., Cedarville, Ohio Jan. 1995.

ClimaxClad Copper–Molybdenum–Copper product brochure, Climax Specialty Materials, Cleveland, Ohio. Jan. 1990.

*Primary Examiner*—Timothy Speer
*Assistant Examiner*—Cathy F. Lam
*Attorney, Agent, or Firm*—Heather L. Creps

[57] ABSTRACT

The substrate (10) has a first side (12) and a second side (14) and includes an insert material (16) having a first thermal conductivity (24) in a first direction (25) and having a second thermal conductivity (26) in a second direction (27). A plurality of vias (30) are formed in the second direction through the insert material and an encapsulant material (18) surrounds the insert material. When an electronic component (22) is disposed on the first side, heat (25) from the electronic component is conducted in the first direction by the insert material and is conducted in the second direction through the plurality of vias.

11 Claims, 1 Drawing Sheet

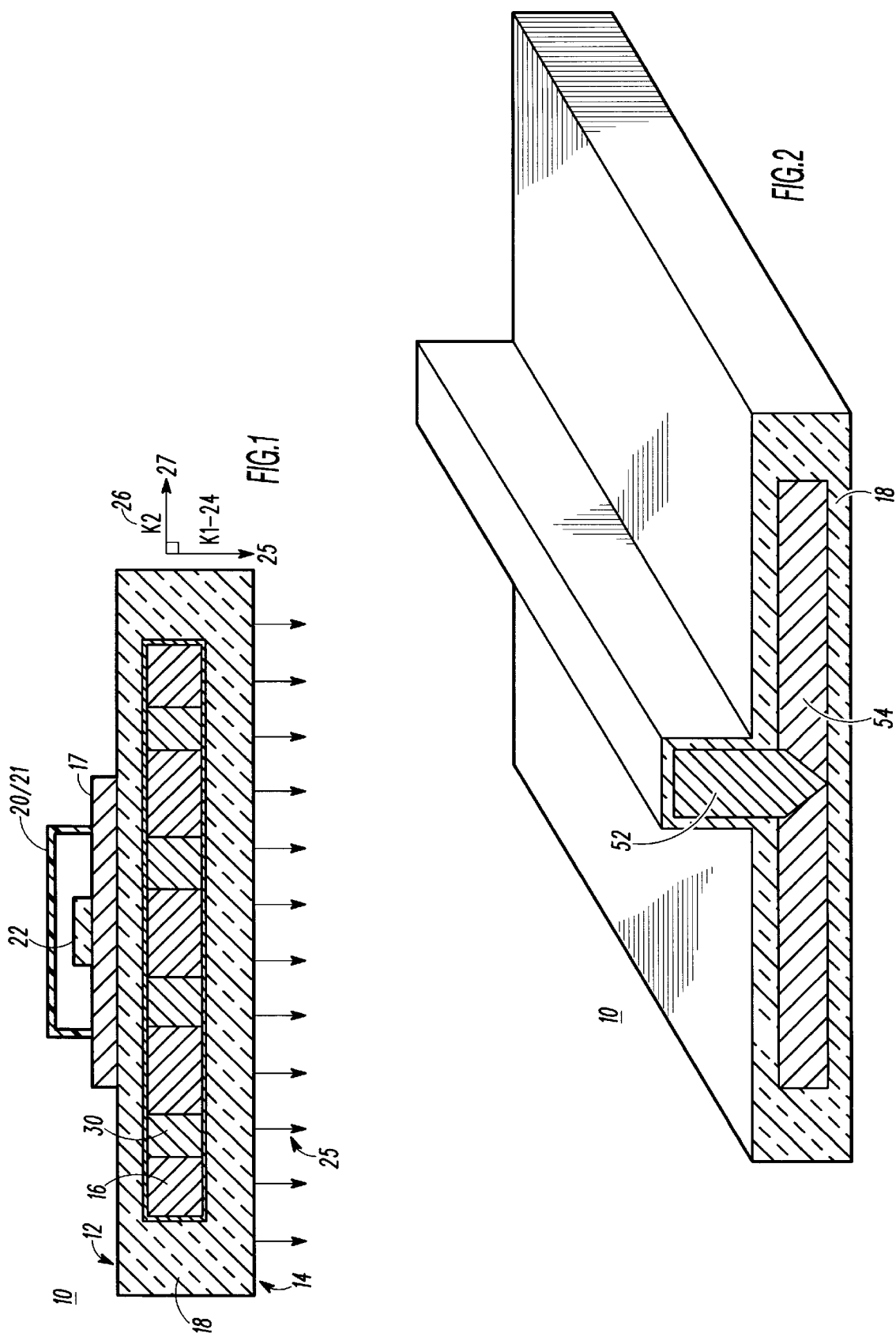

[5,958,572]

HYBRID SUBSTRATE FOR COOLING AN ELECTRONIC COMPONENT

FIELD OF THE INVENTION

This invention relates generally to cooling for electronic components, and more specifically to a hybrid substrate for cooling an electronic component and a method for forming the substrate.

BACKGROUND OF THE INVENTION

Electronic components such as integrated circuits, multi-chip modules, passive components and power transistors, which are generally mounted to substrates such as circuit boards or carrier plates, may be heat sources which require cooling during normal operation.

Some electronic devices have power densities which necessitate the use of sophisticated thermal management techniques such as evaporative spray cooling, cold plates and jet impingement cooling to dissipate the heat generated by the devices.

Certain materials have also been found to be useful for management and removal of heat from electronic devices. For example, U.S. Pat. No. 5,296,310 to Kibler et al. (the '310 patent), which is incorporated herein by reference, discusses a hybrid structural material which combines high thermal conductivity and predetermined mechanical properties.

The '310 patent shows a planar device having a non-structural, high thermal conductivity core material sandwiched between a pair of face sheets. A frame surrounds the core material and is bonded to the face sheets. The device functions to provide a heat flow path through the core material, so that heat flows toward the ends of the planar device.

While hybrid materials and advanced cooling techniques may be combined to maintain an electronic component at a desirable operating temperature, design parameters (e.g., size, weight, flow rates, etc.) of certain cooling systems, particularly liquid cooling systems, may be optimized if temperature gradients present on cooled surfaces are minimized.

The device of the '310 patent, however, may result in a high temperature gradient being present at certain areas of the device, such as at the ends of the plane.

There is therefore a need for a hybrid substrate for cooling an electronic component which, among other things, minimizes a temperature gradient on a surface of the substrate.

SUMMARY OF THE INVENTION

According to an aspect of the present invention, the foregoing needs are addressed by a substrate for receiving and cooling an electronic component. The substrate has a first side and a second side and includes an insert material having a first thermal conductivity in a first direction and having a second thermal conductivity in a second direction. A plurality of vias are formed in the second direction through the insert material and an encapsulant material surrounds the insert material. When an electronic component is disposed on the first side, heat from the electronic component is conducted in the first direction by the insert material and is conducted in the second direction through the plurality of vias.

According to another aspect of the present invention, a substrate includes a first material having a high thermal conductivity in a first direction and having a lower thermal conductivity in a second direction. The second direction is normal to the first direction. A plurality of vias extend through the first material. A second material, which is deposited by disposing the first material in a silicon carbide preform to form an assembly, then injecting liquid aluminum into the assembly, encapsulates the first material. The liquid aluminum penetrates the silicon carbide preform to form aluminum silicon carbide (AlSiC) and the liquid aluminum fills the plurality of vias.

According to a further aspect of the present invention, a method for forming a substrate includes: providing a first material having a first thermal conductivity in a first direction and having a second thermal conductivity in a second direction, the second direction normal to the first direction, the first material having a plurality of vias extending therethrough; disposing the first material in a silicon carbide preform to form an assembly; and injecting aluminum into the assembly.

According to a still further aspect of the present invention, a substrate for receiving and cooling an electronic component has a first side and a second side and includes a first portion of an insert material, the insert material having a first thermal conductivity in a first direction and having a second thermal conductivity in a second direction. A second portion of the insert is disposed at an angle to the first portion. An encapsulant material surrounds the first and second portions of the insert material, respectively, so that when an electronic component is disposed on the first side, heat from the electronic component is conducted in the first direction by the first portion of the insert material and conducted in the second direction by the second portion of the insert material.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 1 is a cross-sectional view of a substrate for cooling an electronic component according to a preferred embodiment of the present invention.

FIG. 2 is a perspective view of an alternate embodiment of a substrate for cooling an electronic component.

DETAILED DESCRIPTION OF THE PREFERRED EMBODIMENTS

Turning now to the drawings, wherein like numerals designate like components, FIG. 1 is a cross-sectional view of an apparatus 10, such as a substrate, for cooling an electronic component 20 according to a preferred embodiment of the present invention. Substrate 10 has a first side 12 and a second side 14.

Electronic component 20 is disposed on first side 12, and includes a base 17, a cover 21 and one or more silicon dice 22, which are protected by cover 21. Electronic component 20 may be, for example, an NPN Silicon Radio Frequency (RF) Power Transistor such as a flangeless RF power transistor, and may be mounted directly to first side 12, or may be attached to a mounting plate (not shown), which is in turn secured to first side 12. References to electronic component 20 will be understood to apply not only to component 20 as depicted and described in connection with FIG. 1, but also to completely different components, including but not limited to passive components, all types of integrated circuits, multi-chip modules and hybrid circuits.

To create a hybrid structure, an insert material 16 is surrounded by encapsulating material 18. Material 16 is disposed proximate, preferably directly underneath, component 20. Material 16 preferably has a first thermal conductivity K1 24 in a first direction 25, and a second thermal conductivity K2 26 in a second direction 27, the first and second directions being normal to each other. For cooling applications where heat fluxes may be high on cooled interfaces, thermal conductivity K1 24 is preferably substantially lower than second thermal conductivity K2 26. For other applications, it K1 24 and K2 26 have substantially similar thermal conductivities. A suitable material is a thermal pyrolytic graphite (TPG) material, commercially available from Advanced Ceramics Corporation in Lakewood, Ohio. Other suitable materials include, but are not limited to diamond-like-carbon (DLC) and diamond.

Encapsilating material 18 preferably has a coefficient of thermal expansion similar to silicon dice 22, so that, among other things, dice 22 may be brazed or soldered or otherwise joined directly to material 18, if desired. An example of a suitable material is aluminum silicon carbide (AlSiC).

As described in U.S. Pat. No. 5,296,310 to Kibler et al., which is incorporated herein by reference, it is desirable to achieve close physical contact between insert material 16 and encapsulating material 18, so that good heat transfer may occur between dice 22, encapsulating material 18 and insert material 16.

It is contemplated that heat 25 is removed from second side 14 of substrate 10 using advanced thermal management techniques including but not limited to cold plates or evaporative spray cooling. To achieve optimum design parameters (e.g., size, weight, flow rates, etc.) of such cooling systems, it is desirable to minimize temperature gradients present on cooled surfaces such as second side 14. Heat 25 may also be removed from top face 12, particularly when directly cooling electronic component 20.

As shown in FIG. 1, and in accordance with a preferred embodiment of the present invention, a number of selectively placed vias 30 are formed in first direction 25 through insert material 16. Vias are preferably placed under or near heat-generating electronic components such as component 20. Vias 30 allow for the channeling of heat in first direction 25, into the core of insert material 16, so that at a cooled side such as second side 14 or first side 12, a temperature gradient is preferably predictable, uniform and minimized. That is, vias 30 conduct heat in direction 25 in order to take advantage of the high thermal conductivity of the insert material 16, which spreads heat in direction 27. Vias 30 may be filled with encapsulating material 18 or impregnated with aluminum 60 (discussed further below). Vias 30 may be formed in any desired configuration, and each may have a cross-sectional shape which is conical, cylindrical, rectangular or another suitable shape. In addition, vias 30 may be configured in any manner effective to reduce stress concentrations or improve mechanical integrity of substrate 20.

As shown in FIG. 2, with reference to FIG. 1 as appropriate, in accordance with another embodiment of the present invention substrate 10 includes a first portion 52 of insert material 16 and a second portion 54 of insert material 16 placed at an angle with respect to each other, such as a right angle. As shown, first and second portions 52, 54 are surrounded by encapsulating material 18.

As discussed in connection with FIG. 1, each portion 52, 54 conducts heat differently in first and second directions 25, 27 respectively, so that first portion 52 as positioned has thermal conductivity K2 26 in first direction 25 and second portion 54 has thermal conductivity K2 26 in second direction 27. In this manner, heat from die 22 may be conducted in first direction 25 by first portion 52 and in second direction 27 by second portion 54. Such a configuration may be useful for channeling heat away from die 22 when die 22 is disposed above first side 12 of substrate 10. Vias 30 may also be used in connection with the configuration shown in FIG. 2.

One method of manufacture of substrate 10 includes placing insert material 16 having vias 30 formed therein into a mold (not shown), and injecting a silicon carbide slurry around insert material 16. The resulting preform is than infiltrated with aluminum to complete the process of creating an encapsulating AlSiC material. Because AlSiC contracts upon cooling more than insert material 16 such as TPG, a compression/interference fit may be created between encapsulating material 18 and insert material 16. During cooling, vias 30 also help to compress sides 12 and 14 toward insert material 16, so that a good thermal interface is formed between encapsulating material 18 and insert material 16.

Alternatively, insert material 16 may be disposed in a pre-manufactured silicon carbide preform (not shown). Liquid aluminum 60 may then be injected into the assembly formed by insert material 16 and the silicon carbide preform.

It has been found that aluminum 60 so infiltrated/injected tends to fill spaces between encapsulating material 18 and insert material 16, and also fills vias 30. Thus, vias 30 further aid in conducting heat in first direction 25. Vias may also lend structural strength to substrate 10.

A closed-loop liquid cooling system (not shown) for cooling substrate 10 may also be provided. For example, a fluid pump may supply a coolant fluid such as water or a dielectric coolant to second side 14 of substrate 10.

A heat exchanger may be connected to the fluid pump and may accept heated fluid, rejecting heat from the fluid and supplying cooled fluid to the fluid pump. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one apparatus or substrate may be connected to a single source of coolant or that one or more sources of coolant may be connected to a single apparatus, for example, for redundancy purposes.

Sizes of fluid pumps and heat exchangers should be selected based on heat removal and flow rate requirements. For example, a typical closed-loop fluid flow is 500 to 1000 milliliters per minute for 500 to 1000 Watts of heat dissipation. Pump and heat exchanger assemblies in various sizes, as well as acceptable tubings and fittings, are available from Cole-Parmer in Vernon Hills, Ill., as well as other common sources.

An electronic component or a group of electronic components may be effectively cooled using the disclosed substrates and methods. For a given heat load, heat transfer may be increased, fluid flow rates decreased and cooling system size reduced when a temperature gradient on second side 14 is minimized through the use of vias 30.

It should be appreciated that the embodiments of the present invention are not limited to cooling an electronic component, but may be adapted to cool any heat source, for example, a heat sink or flange which is mounted to a substrate in a traditional fashion. In addition, it may be desirable to create an anisotropic substrate using the embodiments of the present invention.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. A substrate for receiving and cooling an electronic component, the substrate having a first side and a second side, the substrate comprising:

an insert material having a first thermal conductivity in a first direction and having a second thermal conductivity in a second direction;

a plurality of vias formed through the insert material, the vias formed in the second direction; and an encapsulant material surrounding the insert material, when an electronic component is disposed on the first side, heat from the electronic component conducted in the first direction by the insert material and conducted in the second direction through the plurality of vias.

2. The substrate according to claim 1, wherein the first thermal conductivity is greater than the second thermal conductivity.

3. The substrate according to claim 2, wherein the first direction is normal to the second direction.

4. The substrate according to claim 1, wherein the insert material comprises thermal pyrolytic graphite.

5. The substrate according to claim 1, wherein the encapsulant material comprises aluminum silicon carbide (AlSiC).

6. The substrate according to claim 1, wherein when heat from the electronic component is conducted in the first direction by the insert material and is conducted in the second direction through the plurality of vias, a temperature gradient on the second side is substantially mitigated.

7. The substrate according to claim 1, wherein positions of the plurality of vias are selectable, so that the temperature gradient is modifiable.

8. A substrate comprising:

a first material having a high thermal conductivity in a first direction and having a lower thermal conductivity in a second direction, the second direction normal to tho first direction, a plurality of vias extending through the first material and configured to conduct heat in the second direction; and a second material encapsulating the first material, the second material deposited by disposing the first material in a silicon carbide preform to form an assembly, then injecting liquid aluminum into the assembly, the liquid aluminum penetrating the silicon carbide preform to form aluminum silicon carbide (AlSiC) and the liquid aluminum filling the plurality of vias.

9. The substrate according to claim 8, wherein heat is conducted in the first direction by the first material and conducted in the second direction through the plurality of vias.

10. The substrate according to claim 8, wherein the assembly comprises a slurry mold.

11. The substrate according to claim 8, wherein a coefficient of thermal expansion of the second material is higher than a coefficient of thermal expansion of the first material, so that the first material is under compression.

* * * * *